United States Patent
Nickelsen, Jr. et al.

(10) Patent No.: US 8,502,361 B1
(45) Date of Patent: Aug. 6, 2013

(54) CONCENTRATED PHOTOVOLTAIC RECEIVER PACKAGE WITH STACKED INTERNAL SUPPORT FEATURES

(75) Inventors: John M. Nickelsen, Jr., Gilbert, AZ (US); Pil Je Sung, Dongjak-gu (KR); Garry Pycroft, San Jose, CA (US)

(73) Assignee: Amkor Technology, Inc., Chandler, AZ (US)

( * ) Notice: Subject to any disclaimer, the term of this patent is extended or adjusted under 35 U.S.C. 154(b) by 343 days.

(21) Appl. No.: 12/964,468

(22) Filed: Dec. 9, 2010

(51) Int. Cl.
*H01L 23/495* (2006.01)

(52) U.S. Cl.
USPC .......... 257/676; 257/666; 257/678; 136/252; 136/230

(58) Field of Classification Search
USPC .......... 257/676, 666, 673, 678, 690, E33.066; 136/259, 252, 230
See application file for complete search history.

(56) References Cited

U.S. PATENT DOCUMENTS

| | | | |
|---|---|---|---|
| 5,622,873 A | 4/1997 | Kim et al. | |
| 6,005,287 A | 12/1999 | Kaiya et al. | |
| 6,040,626 A | 3/2000 | Cheah | |
| 6,650,004 B1 | 11/2003 | Horie | |
| 6,794,740 B1 | 9/2004 | Edwards | |
| 6,815,244 B2 | 11/2004 | Böttner et al. | |
| 6,844,615 B1 | 1/2005 | Edwards | |
| 7,002,241 B1 | 2/2006 | Mostafazadeh | |
| 2003/0075213 A1 | 4/2003 | Chen | |
| 2005/0051205 A1* | 3/2005 | Mook | 136/255 |
| 2011/0265871 A1* | 11/2011 | Lamarche | 136/259 |

* cited by examiner

*Primary Examiner* — Julio J Maldonado
*Assistant Examiner* — Robert Bachner

(57) ABSTRACT

In accordance with the present invention, there is provided a CPV package which comprises a leadframe assembly, such leadframe assembly including multiple frames stacked on top of each other. A top frame of the leadframe assembly provides the electrical interconnect between the top or front surface of the receiver die and the bypass diode required to complete the circuit. The top frame also provides hook up wire interconnect pads for the completed CPV package. An exposed bottom surface of a bottom frame of the leadframe assembly defines a heat spreader which assists in thermal management. The fabrication of the CPV package to include multiple frames stacked on top of each other provides high thermal dissipation and high voltage isolation, while at the same providing a high level of reliability with a comparatively low manufacturing cost.

18 Claims, 7 Drawing Sheets

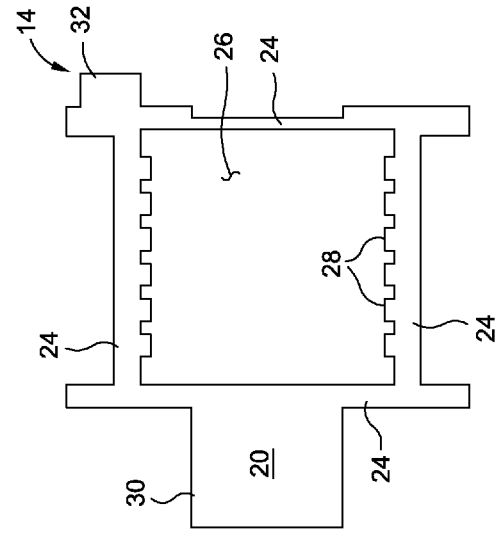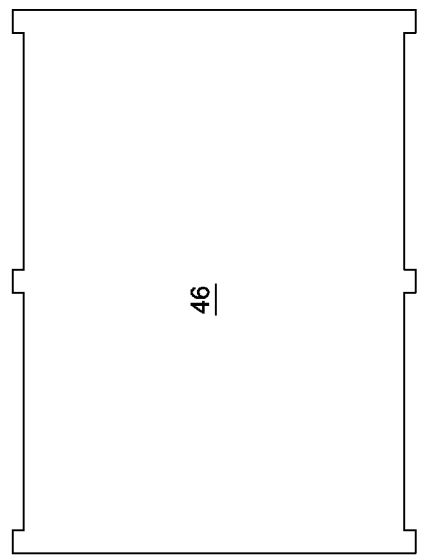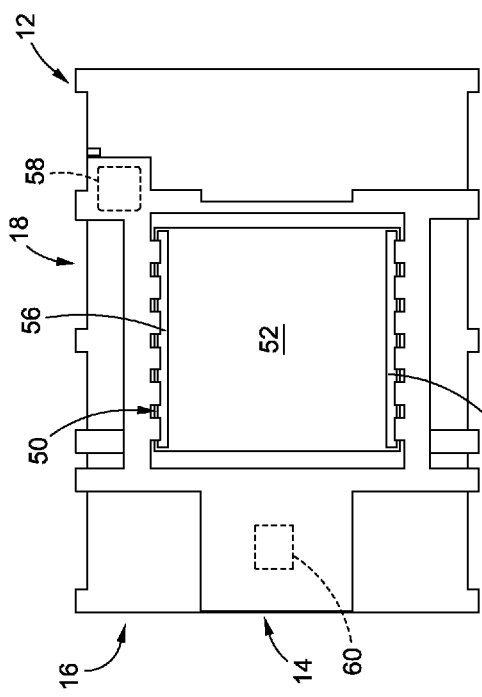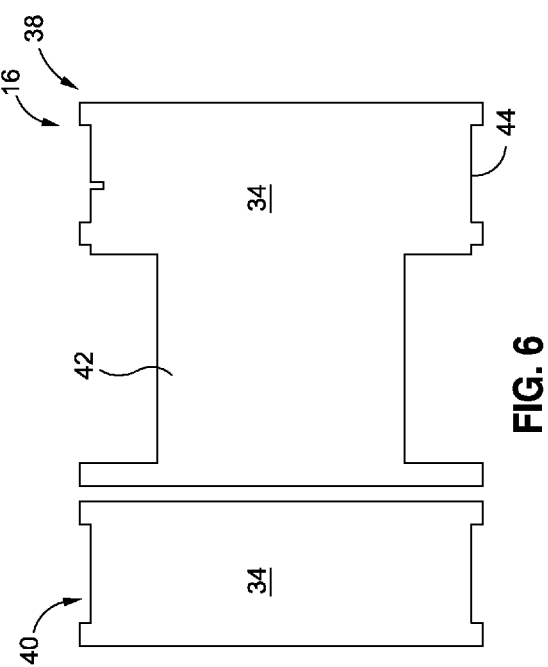

CONCENTRATED PHOTOVOLTAIC RECEIVER PACKAGE WITH STACKED INTERNAL SUPPORT FEATURES

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices and, more particularly, to a concentrated photovoltaic (CPV) receiver package or module which is assembled to include a leadframe assembly comprising multiple frames stacked on top of each other in to provide high thermal dissipation and high voltage isolation, while at the same providing a high level of reliability with a comparatively low manufacturing cost.

2. Description of the Related Art

Photovoltaic cells or dies are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent. Currently known photovoltaic cells typically have a generally quadrangular (e.g., square) configuration defining four peripheral side edges, and include a pair of bus bars which are disposed on the top or front surface and extend along respective ones of an opposed pair of the side edges. The bus bars are used to facilitate the electrical connection of the photovoltaic cell to another structure, as described in more detail below.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a CPV receiver cell or die. The electrical connection between the receiver die and the conductive pattern is often facilitated by a pair of punched thin metal foil or braided ribbon/mesh connectors which extend along and are welded or soldered to respective ones of opposed sides of the receiver die, which typically has a quadrangular or square configuration as indicated above. More particularly, the pair of punched thin metal foils or braided ribbon/mesh connectors are welded or soldered to respective ones of the bus bars on the top or front surface of the receiver die. In certain existing CPV modules, the electrical connection of the receiver die to the conductive pattern is facilitated by the use of multiple wires bonded to the bus bars on the front surface of the receiver die and the bond pads of the conductive pattern of the substrate, the wires being used as an alternative to the aforementioned braided ribbon or mesh interconnects. These wire bonds are often fabricated from gold, and are provided in differing numbers and/or diameters depending on the design of the CPV module. The CPV module may further include a light concentration means which is adapted to concentrate solar radiation onto the front surface of the receiver die.

In certain currently known CPV receiver die packages or modules, anywhere from about 500 to about 1500 suns of energy will typically be focused on the receiver cell or die of the CPV package, such receiver die converting the impinging light into electricity and heat which must be effectively dissipated from the CPV package as well. In this regard, the total incoming energy often falls within the range of from about 45 to about 225 watts, of which about 65% is typically converted to heat that must be managed in the CPV package. CPV packages are often electrically connected to each other in series within panels, with multiple panels also being connected in series. These systems often operate at very high voltage, with the requirement typically being that each CPV package provides about 5,000 volts of electrical isolation. The requirements for high thermal dissipation as well as high voltage isolation, coupled with market demands for low cost as well as high reliability, are not satisfied by currently known CPV receiver die packages or modules.

In an attempt to satisfy the aforementioned desired attributes of high thermal dissipation coupled with high voltage isolation in a CPV package, one of the leading solutions provided in the CPV industry is the use of a ceramic core substrate with metal conductors adhered to one or both of its top and bottom surfaces. The ceramic material provides thermal conductivity from the top metal to the bottom metal, as well as voltage isolation between the circuit metallization on the top surface and the external environment. Another approach is to use more traditional semiconductor leadframe based solutions. However, the attempted leadframe solutions have generally been unsuccessful since providing good thermal conductivity concurrently with required voltage isolation has increased the complexity of these solutions, and hence the cost. Even the use of the aforementioned ceramic core substrate with metal conductors as a solution has proven to present difficulties in finding a good tradeoff between high thermal performance, electrical isolation and cost.

The present invention provides a matrix leadframe based approach in a unique assembly sequence to the addresses these and other shortcomings of the prior art CPV packages. In the CPV package of the present invention, a leadframe assembly is provide, such leadframe assembly including multiple frames stacked on top of each other. A top frame provides the electrical interconnect between the top or front surface of the receiver die and the bypass diode required to complete the circuit. The top frame also provides the attach pad or connector for a hook up wire which carriers the current away from the CPV package. In the assembly of the CPV package of the present invention, the top frame is placed into an empty fixture and solder paste is screen printed on areas which will connect to the receiver die, the diode, and a stand off die. The standoff die is a mechanical component only, and serves to maintain the separation between the top frame hook up wire pad and a middle frame of the assembly. The receiver die, the diode, and the standoff die are then each placed onto the top frame in a flip chip orientation so that the bus bars on the receiver die, the anode of the diode and a metalized surface of the standoff die are each in contact with corresponding connection points on the top frame. The assembly is then put through a reflow oven to join the receiver die, diode, and standoff die to the top frame.

In the next process step, the aforementioned middle frame is placed into an empty fixture and run through a dispensing process which deposits a solder paste under where the receiver die and diode will be connected thereto. Reusable shims are placed over locating features in the fixture and on top of side rails of the middle frame. These shims are used to maintain a prescribed gap between the top and middle frames. The top frame is then placed onto the fixture using features in the fixture to ensure the required alignment between the top and middle frames. The assembly is then put through a reflow. After the top and middle frames have been joined, the handling rails and interconnect structure (i.e., the support structure) of the top frame are cut away so that only the hook up wire pads will electrically accessible outside of the final CPV package. However, the middle frame retains its handling rails and interconnect structure.

In the next process step, a bottom frame is placed into an empty fixture and run through a dispensing process during which a thermally conductive, but electrically isolating thermal interface material (or TIM material) is deposited thereon. The previously joined top and middle frames are placed into the fixture and located relative to the bottom frame using features in the fixture. The previously deposited TIM material makes contact between the middle and bottom frames. The assembly is then placed into an oven and cured. After cure, the handling rails and interconnect structure of the middle frame are cut away such that only the hook up wire pads of the top frame will be electrically accessible outside of the completed CPV package. The bottom frame retains its handling rails and interconnect structure. The three layer structure including the top, middle and bottom frames is then over-molded such that the top of the receiver die, the two hook up wire interconnect pads and the bottom surface of the bottom frame remain exposed. Finally, the bottom frame handling rails and interconnect structure are then cut away leaving the finished and singulated CPV package.

Part of the uniqueness of the above-described CPV package lies in connecting a leadframe to the bus bars of the receiver die and to the bypass diode using solder, which provides the CPV package with much lower electrical resistance, while also improving the power out of the CPV package. Further, connecting the bottom of the receiver die and the cathode of the bypass diode using solder provides the CPV package with much lower electrical resistance, and improves the power out of the package as well. Still further, the TIM material used in the CPV package of the present invention provides lower thermal resistance, and is thinner then the alumina structures currently in use of existing CPV packages, thus providing superior thermal management. Further, that the top and middle frames of the CPV package have no exposed metal other than the hook up wire interconnect pads makes the CPV package inherently superior from a voltage isolation standpoint. The exposed heat spreader defined by the exposed bottom surface of the bottom frame also provides a superior interface to the next level of thermal management. Thus, the CPV package of the present invention provides superior electrical and thermal performance, while providing approximately 5,000 volts of isolation demanded by most applications. These and other features of the present invention will be described in more detail below.

BRIEF DESCRIPTION OF THE DRAWINGS

These, as well as other features of the present invention, will become more apparent upon reference to the drawings wherein:

FIG. 4 is a top plan view of the CPV package of the present invention in a partially completed state of fabrication prior to the formation of the mold body thereof;

FIG. 5 is a top plan view of the bottom frame component of the leadframe of the CPV package of the present invention;

FIG. 6 is a top plan view of the middle frame component of the leadframe of the CPV package of the present invention;

FIG. 7 is a top plan view of the top frame component of the leadframe of the CPV package of the present invention.

Common reference numerals are used throughout the drawings and detailed description to indicate like elements.

DETAILED DESCRIPTION OF THE INVENTION

Figure 1:
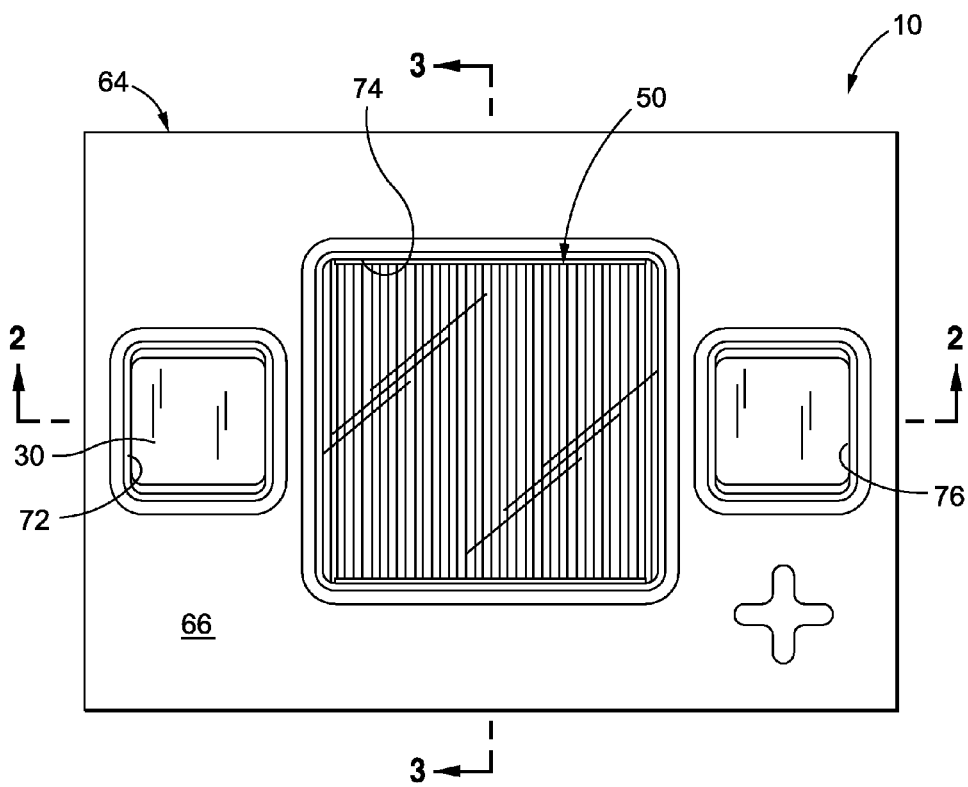
FIG. 1 is a top plan view of a CPV module or package constructed in accordance with the present invention.
Figure 2:
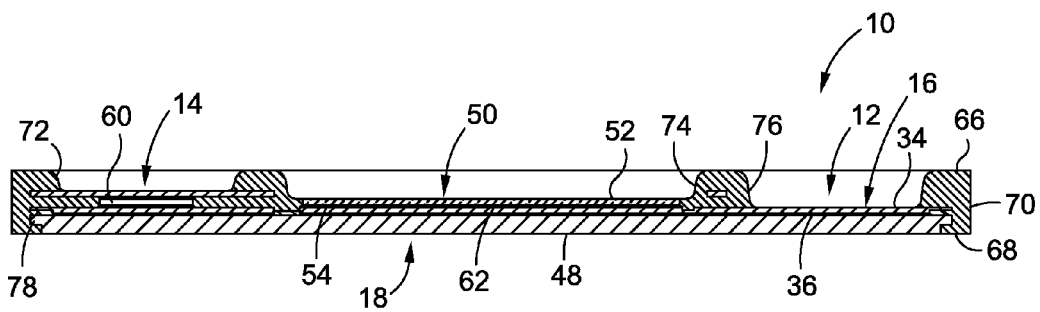
FIG. 2 is a cross-sectional view taken along line 2-2 of FIG. 1.
Figure 3:
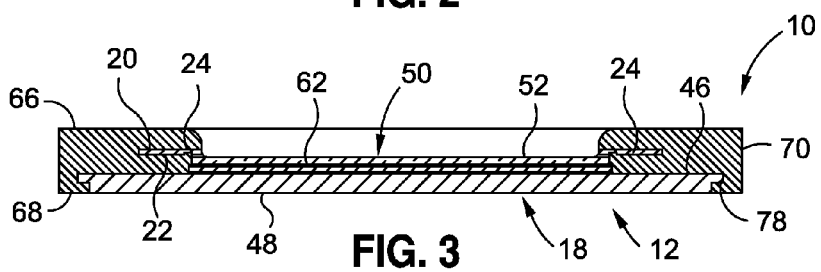
FIG. 3 is a cross-sectional view taken along line 3-3 of FIG. 1.

Referring now to the drawings wherein the showings are for purposes of illustrating a preferred embodiment of the present invention only, and not for purposes of limiting the same, FIGS. 1-3 depict a concentrated photovoltaic (CPV) package or module 10 constructed in accordance with the present invention. In FIGS. 1-3, the CPV package 10 is depicted in its fully fabricated state. In FIG. 4, the CPV module 10 is depicted in partially completed states of fabrication, with FIGS. 8A-8I depicting an exemplary sequence of steps for facilitating the fabrication of the CPV package 10.

Referring now to FIGS. 1-7, the CPV module 10 comprises a leadframe assembly 12 which comprises a first or top frame 14 (shown in FIG. 5), a second or middle frame 16 (shown in FIG. 6), and a third or bottom frame 18 (shown in FIG. 7) which are stacked upon each other in a prescribed arrangement, as will be described in more detail below. As best seen in FIG. 5, the top frame 14 of the leadframe assembly 12 has a generally quadrangular configuration and, from the perspective shown in FIGS. 2 and 3, defines a generally planar top surface 20, and an opposed, generally planar bottom surface 22. Additionally, as best seen in FIG. 5, the top frame 14 includes four side segments 24 which are integrally connected to each other, and are arranged in a generally square pattern. As such, the side segments 24 collectively define an opening 26. As further seen in FIG. 5, one pair of the side segments 24 which extend in spaced, generally parallel relation to each other each define a plurality (e.g., six) contact fingers or tab portions 28 which protrude into the interior of the opening 26. As is apparent from FIG. 5, each of the tab portions 28 on one of the side segments 24 including the same is disposed in opposed relation to a corresponding one of the tab portions 28 defined by the remaining one of the side segments 24 including the same. Those of ordinary skill in the art will recognize that the formation of six tab portions 28 on each of the side segments 24 including the same is exemplary only, and that such number of tab portions 28 may be decreased or increased without departing from the spirit and scope of the present invention.

The top frame 14 of the leadframe assembly 12 further includes an interconnect pad portion 30 which, as also seen in FIG. 5, protrudes outwardly from the central region of one of the two side segments 24 which does not include the tab portion 28 formed thereon. Thus, the interconnect pad portion 30 extends away from the opening 26, rather than residing within the interior thereof. Still further, the top frame 14 includes a diode attach pad portion 32 which protrudes outwardly from one end region of that side segment 24 which extends in spaced, generally parallel relation to the side segment 24 having the interconnect pad portion 30 protruding therefrom. Thus, like the interconnect pad portion 30, the diode attach pad portion 32 does not reside within the interior of the opening 26. The use of the interconnect and diode attach pad portions 30, 32 of the top frame 14 will be described in more detail below.

Referring now to FIG. 6, the middle frame 16 of the leadframe assembly 12, when viewed from the perspective shown in FIGS. 2 and 3, also defines a generally planar top surface 34, and an opposed, generally planar bottom surface 36. Additionally, as is apparent from FIG. 6, the middle frame 16 is not a unitary structure. Rather, the middle frame 16 includes a first section 38 and a second section 40 which are disposed in spaced relation to each other. The first section 38 defines a die attach pad portion 42 which has a generally square configuration. The die attach pad portion 42 is integrally connected to and protrudes from a central region of one side of an interconnect portion 44 of the first section 38 which itself has a generally rectangular configuration. The second section 40 of the middle frame 16 has a generally rectangular configuration mirroring that of the interconnect portion 44 of the first section 38. As is further shown in FIG. 6, the first and second sections 38, 40 are oriented relative to each other such that the die attach pad portion 42 of the first section 38 resides between the interconnect portion 44 thereof and the second section 40.

Referring now to FIG. 7, the bottom frame 18 of the leadframe assembly 12, when viewed from the perspective shown in FIGS. 2 and 3, also defines a generally planar top surface 46, and an opposed, generally planar bottom surface 48. The bottom frame 18 also has a generally rectangular configuration. In this regard, the length and width dimensions of the bottom frame 18 are roughly equal to the maximum length and width dimensions of the middle frame 16.

In the CPV package 10 of the present invention, it is contemplated that the leadframe assembly 12, and in particular the top, middle and bottom frames 14, 16, 18 thereof, will be fabricated from a suitable conductive metal material, such as copper, copper with nickel, copper with PPF, etc. Additionally, as will be discussed below in relation to FIGS. 8A-8I, in the manufacturing process corresponding to the CPV package 10, it is contemplated that the top, middle and bottom frames 14, 16, 18 will each originally be provided as part of an etched or stamped strip. In this regard, the top, middle, and bottom frames 14, 16, 18 will each include interconnect structures which facilitate the integral connection thereof to handling rails or side rails ultimately removed during a singulation process completed as part of the fabrication process for the CPV package 10.

The CPV package 10 constructed in accordance with the present invention further comprises a photovoltaic receiver cell or die 50. The receiver die 50 has a generally square configuration, and defines a generally planar top or front surface 52, and an opposed, generally planar bottom or back surface 54. In addition, the receiver die 50 defines four (4) generally straight peripheral side surface segments. The receiver die 50 is fabricated from a number of layers, including an active layer which is applied to one side or face of an underlying substrate, and defines the front surface 52 of the receiver die 50. The active layer includes a pair of elongate contact strips or bus bars 56 which extend in spaced, generally parallel relation to each other along respective ones of an opposed pair of the peripheral side surface segments of the receiver die 50.

In the CPV package 10, the receiver die 50 is electrically connected to the top frame 14. More particularly, such electrical connection is facilitated by attaching and electrically connecting each of the tab portions 28 protruding from one of the side segments 24 to a respective one of the bus bars 56 of the receiver die 50, the bus bars 56 being attached to those portions of the bottom surface 22 of the top frame 14 which are defined by corresponding sets of the tab portions 28. Such electrical connection is preferably facilitated through the use of conductive solder paste or epoxy, though the present invention is not intended to be limited to any specific attachment material. When the bus bars 56 of the receiver die 50 are electrically connected to corresponding sets of the tab portions 28 in the aforementioned manner, the vast majority of the front surface 52 of the receiver die 50 is exposed within the opening 26 defined by the top frame 14 in the manner best shown in FIG. 4.

In addition to the receiver die 50, the CPV package 10 includes a bypass diode 58 which has a generally square configuration and is attached and electrically connected to that region of the bottom surface 22 of the top frame 14 defined by the diode attach pad portion 32 thereof. The attachment and electrical connection of the anode of the bypass diode 58 to the underside of the diode attach pad portion 32 is also preferably facilitated through the use of conductive solder paste or epoxy. Thus, both the receiver die 50 and the bypass diode 58, by virtue of their electrical connection to the top frame 14, are in turn electrically connected to each other.

The CPV package 10 further comprises a standoff die 60 which, like both the receiver die 50 and bypass diode 58, has a generally square configuration and is also attached to the top frame 14. More particularly, the standoff die 60 is attached to that region of the bottom surface 22 of the top frame 14 which is defined by the interconnect pad portion 30 thereof. The standoff die 60 is preferably fabricated from silicon, with the attachment thereof to the underside of the interconnect pad portion 30 preferably being facilitated through the use of the solder paste or epoxy described above.

In the CPV package 10, the receiver die 50, the bypass diode 58, and the standoff die 60, in addition to each being attached to the top frame 14, are also attached to the middle frame 16. More particularly, the back surface 54 of the receiver die 50 is attached and electrically connected to that region of the top surface 34 of the middle frame 16 defined by the die attach pad portion 42 of the first section 38 through the use of a conductive solder paste or epoxy. Similarly, that surface or face of the bypass diode 58 which is opposite that attached to the bottom surface 22 of the top frame 14 and defines the cathode is attached and electrically connected to a prescribed region of the top surface 34 of the middle frame 16 defined by the interconnect portion 44 of the first section 38 thereof through the use of a conductive solder paste or epoxy. Further, that surface or face of the standoff die 60 opposite that attached to the bottom surface 22 of the top frame 14 is attached to a prescribed region of the top surface 34 of the middle frame 16 defined by the second section 40 thereof through the use of a conductive solder paste or epoxy. As a result, the receiver die 50, the bypass diode 58 and the standoff dies 60 are each sandwiched or captured between the top and middle frames 14, 16. As indicated above, in the CPV package 10, the standoff die 60 is a mechanical component which is used to maintain a prescribed spatial separation or gap between the interconnect pad portion 30 of the top frame 14 and the second section 40 of the middle frame 16.

As is apparent from FIGS. 2-4, in the CPV package 10, the assembly including the top and middle frames 14, 16 having the receiver die 50, bypass diode 58 and standoff die 60 interposed therebetween in the aforementioned manner is itself attached to the bottom frame 18. More particularly, the bottom surface 36 of the middle frame 14 as defined by the first and second sections 38, 40 thereof is attached to the top surface 46 of the bottom frame 18 through the use of a layer 62 of a thermal interface material or TIM material.

In the CPV package 10, at least portions of the top, middle and bottom frames 14, 16, 18 of the leadframe assembly 12, the receiver die 50, the bypass diode 58 and the standoff die 60 are covered by an encapsulant material which, upon hardening, defines a mold body 64 of the CPV package 10. As best seen in FIGS. 1-3, the mold body 64 has a generally quadrangular (e.g., rectangular configuration). Additionally, from the perspective shown in FIGS. 1-3, the mold body 64 defines a generally planar top surface 66, an opposed, generally planar bottom surface 68, and a side surface 70 which is segregated into four (4) generally straight side surface segments.

As further seen in FIGS. 1-3, the mold body 64 is formed to cover the entirety of the top surface 20 of the top frame 14, with the exception of a prescribed region of the top surface 20 which is defined by the interconnect pad portion 30 thereof. In this regard, formed in the top surface 66 of the mold body 64 is a generally square first window 72 in which the interconnect pad portion 30 of the top frame 14 is exposed. Though the mold body 64 covers the peripheral side surface segments of the receiver die 50, the majority of the front surface 52 of the receiver die 50 is exposed in a generally square second window 74 of the mold body 64 which, like the first window 72, is also formed in the top surface 66 thereof. As will be recognized, the length and width dimensions of the second window 74 are substantially equal to those of the opening 26 defined by the top frame 14.

The mold body 64 of the CPV package 10 further covers the peripheral side surface segments of both the bypass diode 58 and standoff die 60. As indicated above, the opposed top and bottom surfaces of such bypass diode 58 (defining the anode and cathode, respectively) and standoff die 60 are attached to respective ones of the bottom surface 18 of the top frame 14, and the top surface 34 of the middle frame 16. Though the majority of the top surface 34 of the middle frame 16 is also covered by the mold body 64, a prescribed region of the top surface 34 defined by the interconnect portion 44 of the first section 38 is exposed in a generally square third window 76 also formed in the top surface 66 of the mold body 64. As best seen in FIG. 1, the length and width dimensions of the first and third windows 72, 76 are substantially equal to each other, and are less than those of the second window 74 which is positioned between the first and third windows 72, 76.

As is most apparent from FIGS. 2 and 3, the mold body 64 is formed to cover those portions of the top surface of the bottom frame 18 which are not already covered by the top and middle frames 14, 16. Though the mold body 64 also covers the peripheral side surface of the bottom frame 18, the majority of the bottom surface 48 of the bottom frame 18 is uncovered by the mold body 64, and thus exposed in the bottom surface 68 thereof. However, as seen in FIGS. 2 and 3 as well, it is contemplated that the peripheral side surface of the bottom frame 18 may be formed to include an undercut or reentrant portion 78 which is filled by the mold body 64, and creates a firm mechanical interlock between the mold body 64 and bottom frame 18, thus preventing any undesired separation therebetween.

In the completed CPV package 10, the mold body 64 is fabricated to be of a thickness which allows those surfaces thereof defining the second window 74 to be used as a modality which facilitates the alignment of a light concentrating device such as an optical light guide or prism to the front surface 52 of the receiver die 50 which, as indicated above, is exposed in the second window 74. Those portions of the top and middle frames 14, 16 exposed within the respective ones of the first and third windows 72, 76 effectively serve as "hook up" interconnect pads which allow for the electrical connection of hook up wires to the CPV package 10 for purposes such as carrying current away from the CPV package 10. Since the only exposed metal of the top and middle frames 14, 16 is that which is exposed in respective ones of the first and third windows 72, 76, the CPV package 10 is inherently superior from a voltage isolation standpoint.

Still further, in the CPV package 10, connecting the bus bars 56 of the receiver die 50 and the bypass diode 58 to the top frame 14 through the use of solder provides the CPV package 10 with much lower electrical resistance and improves the power out thereof. Similarly, connecting the back surface 54 of the receiver die 50 and the cathode of the bypass diode 58 to the middle frame 16 through the use of solder similarly provides the CPV package 10 with much lower electrical resistance and also improves the power out thereof. The exposed bottom surface 48 of the bottom frame 18 in the mold body 64 of the CPV package 10 provides the same with superior thermal performance, the heat generated by the receiver die 50 effectively being transferred to the bottom frame 18 via the middle frame 16 (to which the receiver die 50 is attached) and the layer 62 of the TIM material which is used to facilitate the attachment of the middle frame 16 to the bottom frame 18. As indicated above, the layer 62 of TIM material provides lower thermal resistance and is thinner than the alumina structures used in prior art CPV packages.

Figure 8A:
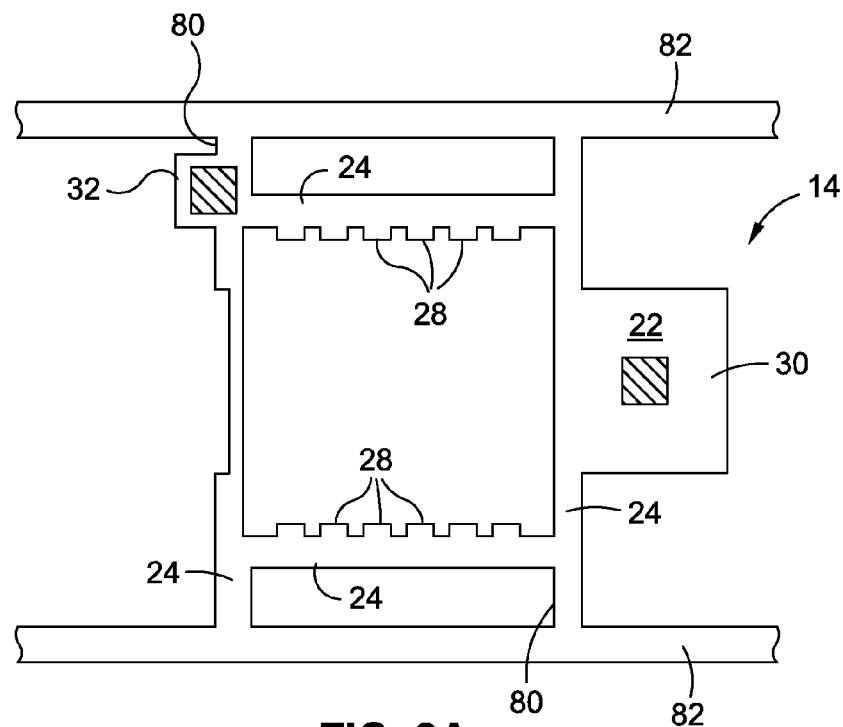
FIGS. 8A-8I depict an exemplary sequence of steps for facilitating the fabrication of the CPV package of the present invention.

Having thus described the structural features of the CPV package 10, an exemplary method of fabricating the same will now be described with specific reference to FIGS. 8-8I. Referring now to FIG. 8A, in an initial step of the fabrication process for the CPV package 10 of the present invention, the top frame 14 is placed into an empty fixture, with conductive solder paste or epoxy being screen printed onto the areas of the top frame 14 which will connect to the receiver die 50, the bypass diode 58, and the standoff die 60. More particularly, the solder paste or epoxy is screen printed onto a prescribed region of the bottom surface 22 of the top frame 14 which is defined by the interconnect pad portion 30 thereof, a prescribed region of the bottom surface 22 which is defined by the diode attach pad portion 32 thereof, and those regions of the bottom surface 22 defined by the tab portions 28 protruding into the opening 26 from a corresponding pair of the side segments 24. As shown in FIG. 8A, in its original, unsingulated state, the top frame 14 includes interconnect structures 80 (e.g., tie bars) which facilitate the integral connection thereof to a spaced, generally parallel pair of side rails 82. Thus, the unsingulated top frame 14 comprises a portion of a leadframe strip which, in addition to the top frame 14, includes the interconnect structures 80 and side rails 82. As indicated above, such leadframe strip including the top frame 14 may be fabricated through the implementation of a suitable etching or stamping process.

Figure 8B:
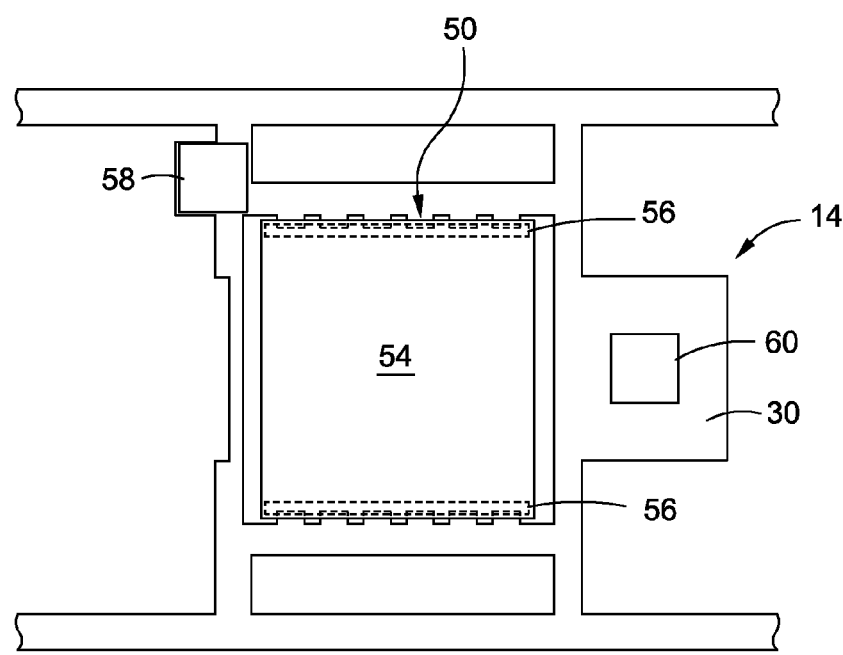

Referring now to FIG. 8B, in the next step of the fabrication process for the CPV package 10, the receiver die 50, the bypass diode 58 and the standoff die 60 are each placed onto the bottom surface 22 of the top frame 14 in a flip chip orientation. More particularly, each of the bus bars 56 of the receiver die 50 is brought into contact with the solder paste or epoxy applied to a corresponding set of the tab portions 28 protruding from a respective one of the side segments 24. The anode of the bypass diode 58 is brought into contact with the solder paste or epoxy applied to the diode attach pad portion 32 of the top frame 14, with a metalized surface of the standoff die 60 being brought into contact with the solder paste or epoxy applied to the interconnect pad portion 30 of the top frame 14. The assembly shown in FIG. 8B is then put through a reflow oven to join the receiver die 50 to the top frame 14.

Figure 8C:
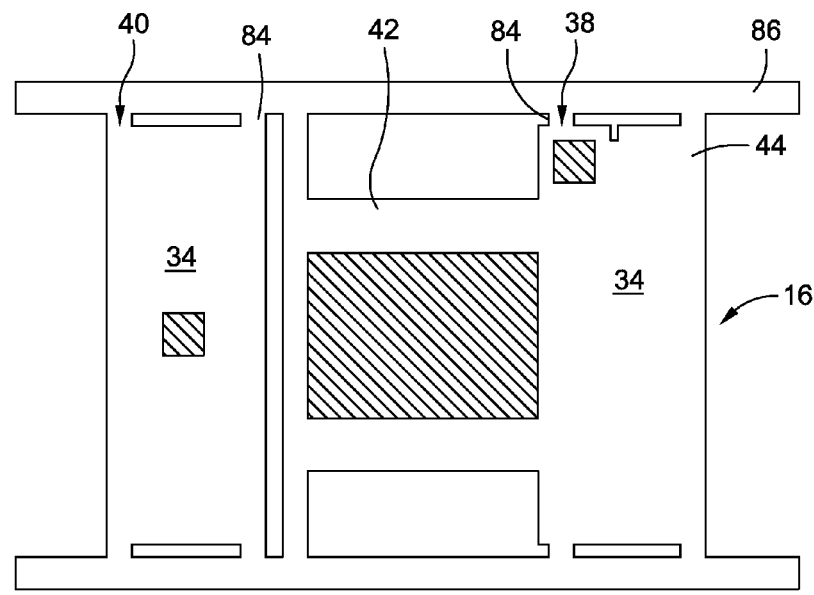

Referring now to FIG. 8C, in the next step of the fabrication process for the CPV package 10, the middle frame 16 is placed into an empty fixture, and run through a dispensing process. The dispensing process is used to deposit conductive solder paste or epoxy on those regions of the top surface 34 of the middle frame 16 where the back surface 54 of the receiver die 50, the cathode of the bypass diode 58, and one side or face of the standoff die 60 will ultimately be connected thereto. More particularly, the solder paste or epoxy is applied to a prescribed region of the top surface defined by the die attach pad portion 42 of the first section 48, a prescribed region of the top surface 34 defined by the interconnect portion 44 of the first section 38, and a prescribed region of the top surface 34 defined by the second section 40, in the manner shown in FIG. 8C. Like the top frame 14, in its original, unsingulated state, the middle frame 16 includes interconnect structures 82 which facilitate the integral connection thereof to a spaced, generally parallel pair of side rails 86. Thus, the unsingulated middle frame 16 comprises a portion of a leadframe strip which, in addition to the middle frame 16, includes the interconnect structures 84 and side rails 86. Such leadframe strip including the middle frame 16 may be fabricated through the implementation of a suitable etching or stamping process.

Figure 8D:
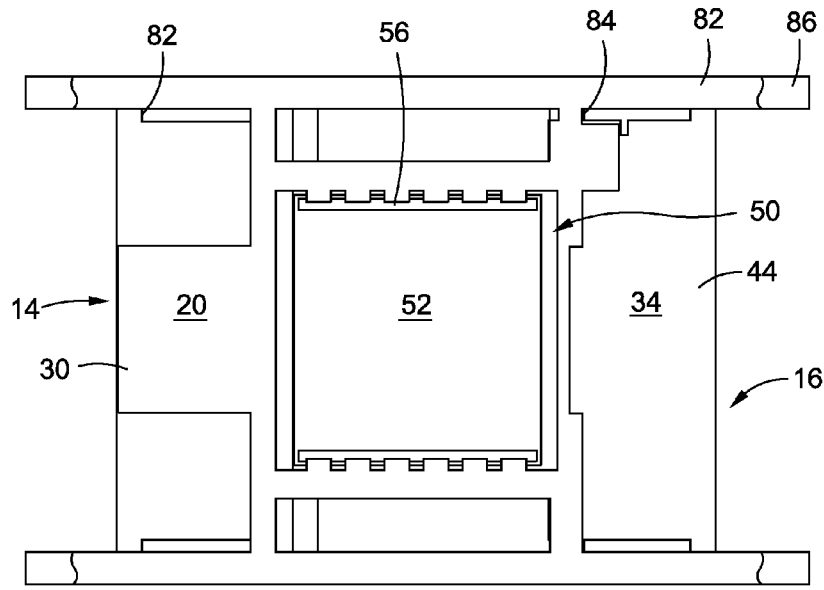

Referring now to FIG. 8D, in the next step of the fabrication process for the CPV package 10, reusable shims (not shown) are placed over locating features in the fixture and on top of the side rails 86 of the leadframe strip including the middle frame 16. The leadframe strip including the top frame 14 in then flipped over from its orientation shown in FIGS. 8A and 8B, and is placed onto the fixture having the leadframe strip with the middle frame 16 interfaced thereto using features in the fixture to ensure a prescribed alignment between the top and middle frames 14, 16. The aforementioned shims are used to maintain a prescribed gap between the top and middle frames 14, 16. The stacked assembly of the leadframe strips including the top and middle frames 14, 16 as shown in FIG. 8D is then put through a reflow.

Figure 8E:
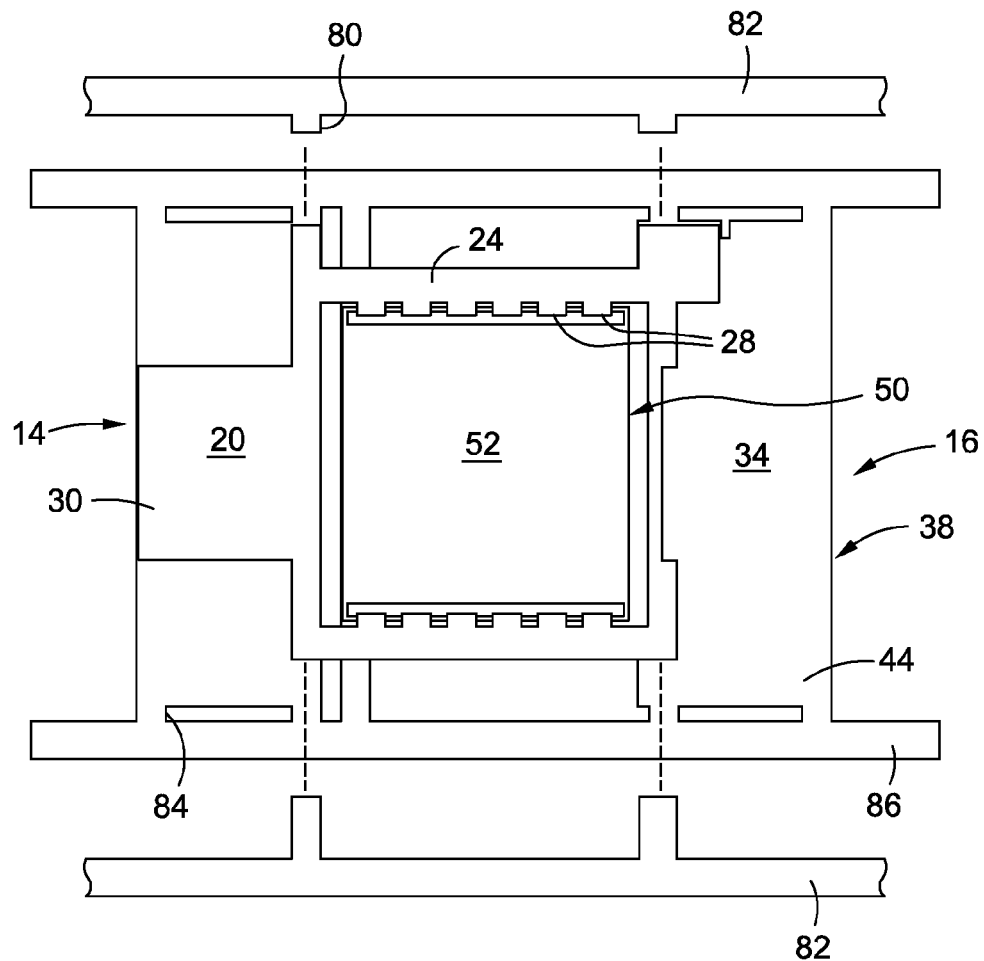

Referring now to FIG. 8E, after the top and middle frames 14, 16 have been joined in the step described above in relation to FIG. 8D, the handling rails or side rails 82 and portions of the interconnect structures 80 of the leadframe strip including the top frame 14 are cut away or singulated. However, as also shown in FIG. 8E, at this stage of the manufacturing process for the CPV package 10, the interconnect structures 84 and side rails 86 of the leadframe strip including the middle frame 16 are not yet cut away or singulated.

Figure 8F:
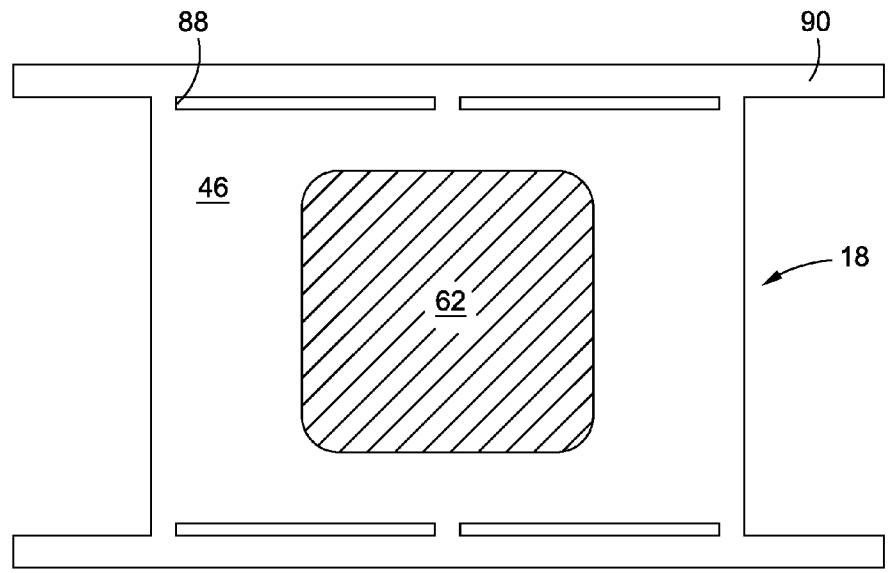

Referring now to FIG. 8F, in the next step of the fabrication process for the CPV package 10, the bottom frame 18 is placed into an empty fixture and run through a dispensing process during which the layer 62 of the TIM material is deposited on a prescribed portion of the top surface 46 thereof. As is shown in FIG. 8F, in its original, unsingulated state, the bottom frame 46 also includes interconnect structures 88 which facilitate the integral connection thereof to a spaced, generally parallel pair of side rails 90. Thus, the unsingulated bottom frame 18 also comprises a portion of a leadframe strip which, in addition to the bottom frame 18, includes the interconnect structures 88 and side rails 90. Such leadframe strip including the bottom frame 18 may be fabricated through the implementation of a suitable etching or stamping process.

Figure 8G:
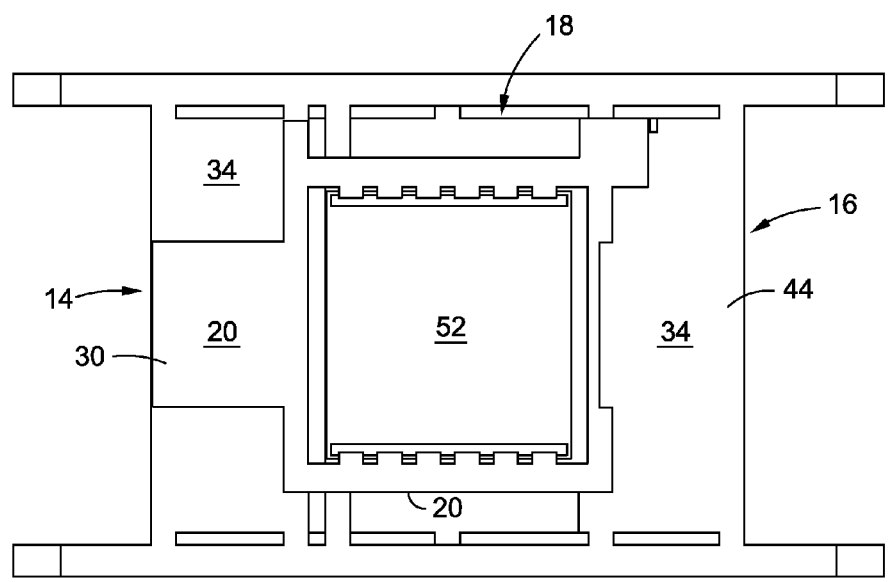

Referring now to FIG. 8G, in the next step of the fabrication process for the CPV package 10, the previously joined top and middle frames 14, 16 as shown in FIG. 8E are placed into the fixture holding the leadframe strip including the bottom frame 18 and located in a prescribed orientation relative thereto using features in the fixture. The stacked assembly of the top, middle and bottom frames 14, 16, 18 shown in FIG. 8G is then placed into an oven and cured.

Figure 8H:
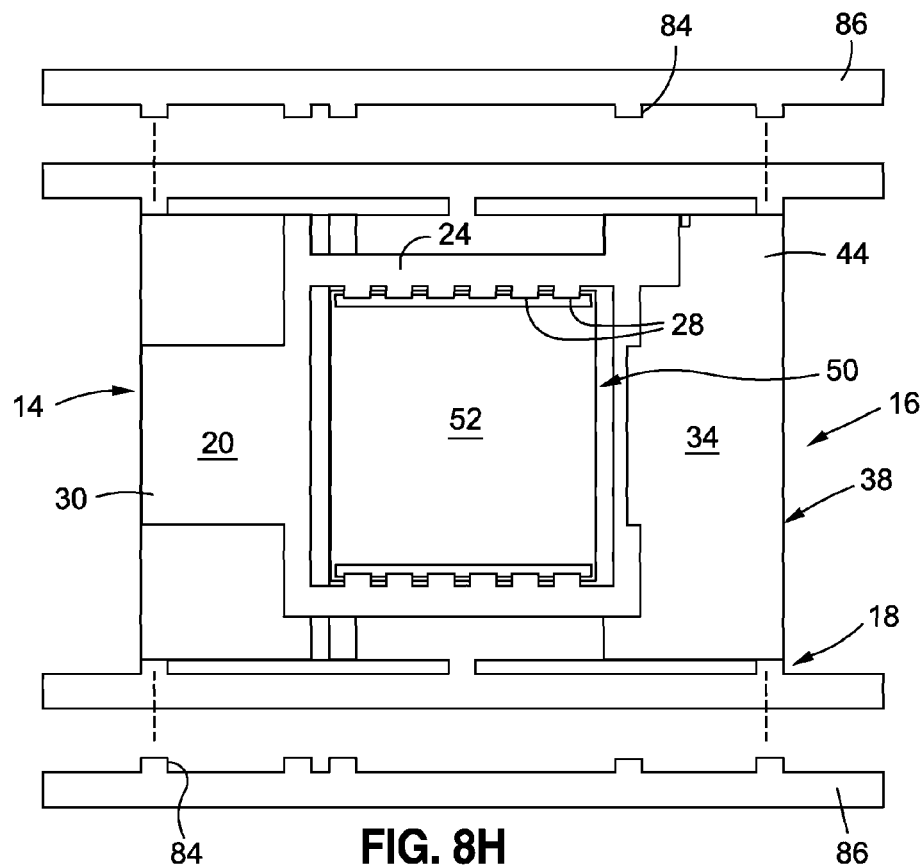

Referring now to FIG. 8H, in the next step of the fabrication process for the CPV package 10, after the curing step described in relation to FIG. 8G above has been completed, the side rails 86 and portions of the interconnect structures 84 of the leadframe strip including the middle frame 16 are cut away or singulated. However, at this stage of the fabrication process for the CPV package 10, the interconnect structures 88 and side rails 90 of the leadframe strip including the bottom frame 18 are not cut away or singulated.

Figure 8I:
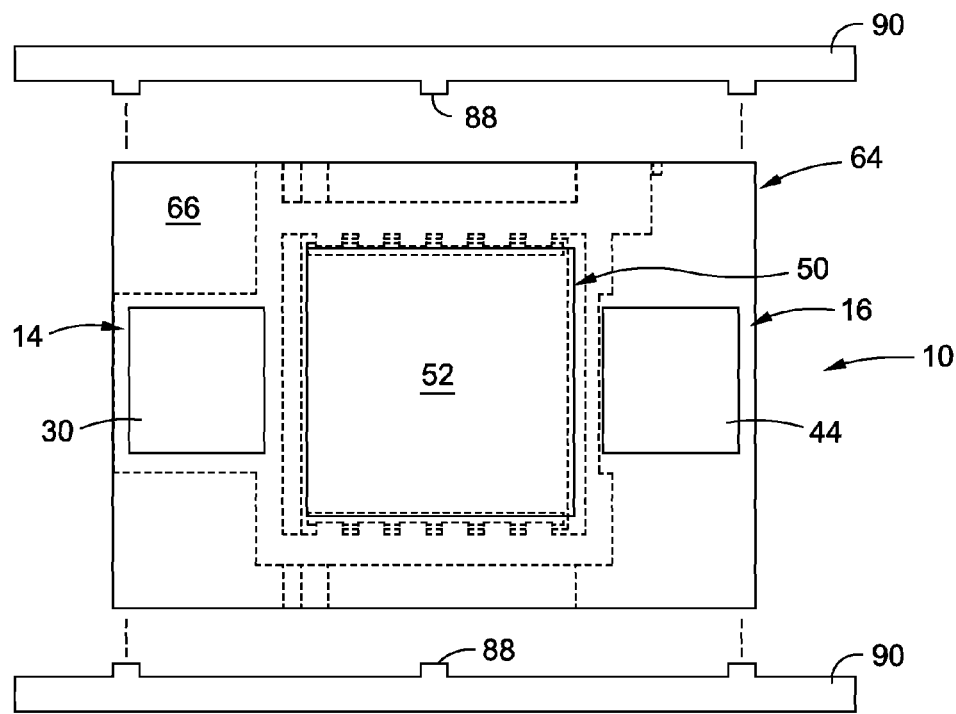

Referring now to FIG. 8I, in the next step of the fabrication process for the CPV package 10, the three layer structure including the top, middle and bottom frames 14, 16, 18 is over-molded in a manner facilitating the formation of the mold body 64. The structural features of the mold body 64 and manner in which the same is applied to the top, middle and bottom frames 14, 16, 18 is described with particularity in relation to FIGS. 1-3 above. Subsequent to the formation of the mold body 64, the side rails 90 and interconnect structures 88 of the leadframe strip including the bottom frame 18 are cut away or singulated, thus completing the formation of the CPV package 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A CPV package, comprising:
   a leadframe assembly including at least first, second and third frames disposed in a stacked arrangement with the third frame attached to the second frame and the second frame being oriented between the first and third frames;
   a receiver die electrically connected to and positioned between prescribed regions of the
   first and second frames; and
   a bypass diode positioned between prescribed regions of the first and second frames, the bypass diode having an anode which is electrically connected to the first frame and a cathode which is electrically connected to the second frame.

2. The CPV package of claim 1 further comprising a mold body which partially covers the leadframe assembly, the mold body defining at least one window in which a portion of the receiver die is exposed.

3. The CPV package of claim 2 wherein the window is defined by a surface of the mold body which is mechanically adapted to facilitate the alignment of a light concentrating device with the portion of the receiver die exposed in the window.

4. The CPV package of claim 2 wherein the mold body defines at least three windows, with one of the windows having a portion of the receiver die exposed therein, one of the windows having a portion of the first frame exposed therein, and one of the windows having a portion of the second frame exposed therein.

5. The CPV package of claim 2 the mold body defines opposed top and bottom surfaces, the window is formed in the top surface, and a portion of the third frame is exposed in the bottom surface.

6. The CPV package of claim 5 wherein the third frame is attached to the second frame by a layer of thermal interface material.

7. The CPV package of claim 5 wherein the third frame of the leadframe assembly is formed to include a reentrant portion which is filled by the mold body to facilitate a mechanical interlock of the mold body to the third frame.

8. The CPV package of claim 1 further comprising a standoff die positioned between prescribed regions of the first and second frames and sized to maintain a gap of a selected dimension therebetween.

9. A CPV package, comprising:
 a leadframe assembly including first, second and third frames disposed in a stacked arrangement, the second frame being oriented between the first and third frames;
 a receiver die electrically connected to and positioned between prescribed regions of the first and second frames;
 a bypass diode positioned between prescribed regions of the first and second frames, the bypass diode having an anode which is electrically connected to the first frame and a cathode which is electrically connected to the second frame; and
 a standoff die positioned between prescribed regions of the first and second frames and sized to maintain a gap of a selected dimension therebetween.

10. The CPV package of claim 9 further comprising a mold body which partially covers the leadframe assembly, the mold body defining at least one window in which a portion of the receiver die is exposed.

11. The CPV package of claim 10 the mold body defines at least three windows, with one of the windows having a portion of the receiver die exposed therein, one of the windows having a portion of the first frame exposed therein, and one of the windows having a portion of the second frame exposed therein.

12. The CPV package of claim 11 wherein the mold body defines opposed top and bottom surfaces, the first, second and third windows are formed in the top surface, and a portion of the third frame is exposed in the bottom surface.

13. The CPV package of claim 12 wherein the third frame is attached to the second frame by a layer of thermal interface material.

14. The CPV package of claim 11 wherein the third frame of the leadframe assembly is formed to include a reentrant portion which is filled by the mold body to facilitate a mechanical interlock of the mold body to the third frame.

15. The CPV package of claim 11 wherein the first frame of the leadframe assembly includes:
 a central opening;
 two sets of tab portions which each protrude into the opening and have the receiver die attached and electrically connected thereto;
 an interconnect pad portion which is exposed in one of the windows and has the standoff die attached thereto; and
 a diode attach pad portion which has the bypass diode attached and electrically connected thereto.

16. The CPV package of claim 15 wherein the second frame of the leadframe assembly includes:
 a first section defining a die attach pad portion having the receiver die attached and electrically connected thereto, and an interconnect portion which is exposed in one of the windows and has the bypass diode attached and electrically connected thereto; and
 a second section which is disposed in spaced relation to the first section and has the standoff die attached thereto.

17. A CPV package, comprising:
 a leadframe assembly including at least first and second frames disposed in a stacked arrangement;
 a receiver die electrically connected to and positioned between prescribed regions of the first and second frames;
 a bypass diode positioned between prescribed regions of the first and second frames, the bypass diode having an anode which is electrically connected to the first frame and a cathode which is electrically connected to the second frame;
 a standoff die positioned between prescribed regions of the first and second frames and sized to maintain a gap of a selected dimension therebetween; and
 a mold body which partially covers the leadframe assembly, the mold body defining at least one window in which a portion of the receiver die is exposed.

18. The CPV package of claim 17 wherein the leadframe assembly further includes a third frame attached to the second frame, the first, second and third frames being disposed in a stacked arrangement, with the second frame being oriented between the first and third frames, and a portion of the third frame being exposed in the mold body.

* * * * *